United States Patent [19]

Shimauchi et al.

[11] Patent Number: 4,689,502
[45] Date of Patent: Aug. 25, 1987

[54] GATE ARRAY LSI DEVICE USING PNP INPUT TRANSISTORS TO INCREASE THE SWITCHING SPEED OF TTL BUFFERS

[75] Inventors: Yoshiki Shimauchi, Kawasaki; Katsuji Hirochi, Yokohama, both of Japan

[73] Assignee: Fujitsu Limited, Kawasaki, Japan

[21] Appl. No.: 938,342

[22] Filed: Dec. 3, 1986

Related U.S. Application Data

[63] Continuation of Ser. No. 594,205, Mar. 31, 1983, abandoned.

[30] Foreign Application Priority Data

Mar. 31, 1983 [JP] Japan ................................ 58-053613

[51] Int. Cl.⁴ ................. H03K 19/013; H03K 19/088; H03K 19/092; H03K 17/04
[52] U.S. Cl. .............................. 307/443; 307/456; 307/255; 307/466; 364/490; 365/72
[58] Field of Search ............... 307/443, 456, 466, 270, 307/303, 313, 300, 445, 255; 364/488–491; 365/72, 63

[56] References Cited

U.S. PATENT DOCUMENTS

| | | |
|---|---|---|
| 3,416,043 | 12/1968 | Jorgensen ........................... 307/443 |
| 3,482,111 | 12/1969 | Gunderson et al. ............. 307/456 X |
| 3,643,232 | 2/1972 | Kilby ................................ 365/72 X |
| 3,999,080 | 12/1976 | Weathersby, Jr. et al. ........ 307/456 |
| 4,045,689 | 8/1977 | Tietz ................................. 307/456 |
| 4,131,808 | 12/1978 | Kuo .............................. 307/443 X |
| 4,174,541 | 11/1979 | Schmitz ......................... 307/456 X |
| 4,535,258 | 8/1985 | Tanizawa ....................... 307/475 X |

Primary Examiner—Stanley D. Miller
Assistant Examiner—David R. Bertelson
Attorney, Agent, or Firm—Staas & Halsey

[57] ABSTRACT

A gate array LSI device having inner gate circuits whose performance is not affected by the load condition and having a large fan-out number. The inner gate circuit comprises one or more PNP-type transistors, each of which receives an input signal at the base thereof, a first NPN-type transistor whose base is connected to the emitters of the PNP-type transistors, and an output buffer circuit. The output buffer circuit includes a second NPN-type transistor, which is controlled by the signal at the emitter of the first NPN-type transistor and outputs electric charges from an output terminal, and a third NPN-type transistor, which is controlled by the signal at the collector of the first NPN-type transistor and which is connected in series with the second NPN-type transistor so as to supply a charging current to the output terminal.

13 Claims, 6 Drawing Figures

GATE ARRAY LSI DEVICE USING PNP INPUT TRANSISTORS TO INCREASE THE SWITCHING SPEED OF TTL BUFFERS

This is a continuation of co-pending application Ser. No. 594,205 filed on Mar. 31, 1983, abandoned.

BACKGROUND OF THE INVENTION

1. Field of the Invention

The present invention relates to a gate array large-scale integrated circuit (LSI) device, more particularly, to a gate array LSI device which uses, as an inner gate circuit, a circuit having PNP-type transistors at the input portion thereof and an off-buffer circuit at the output portion thereof, thereby increasing the degree of freedom of the logical design of the gate array LSI device.

2. Description of the Prior Art

In recent years, semiconductor integrated circuit devices have been made increasingly dense so as to decrease the overall cost and increase the reliability of final electronic devices. An increased density of the semiconductor integrated circuit devices, however, means a more complex arrangement of connection lines on the semiconductor chip and a resultantly greater capacitance of the connection lines. This in turn has an adverse effect on the switching speed of inner gate circuits and so on.

In a gate array LSI device, the connection paths within the semiconductor chip are determined by automatic wiring processing of a computer aided design (CAD) system. Therefore, it is difficult to learn the specific lengths of the inner connection lines. It is also difficult to learn the specific maximum value of the number of gate circuits connected to the output of one inner gate circuit, i.e., the maximum fan-out number. Therefore, it is preferabley to use inner gate circuits whose switching speed and so on are not affected by variation of the length of the connection lines and of the fan-out number.

In a conventional gate array LSI device, each inner gate circuit used therein comprises an input stage formed of a NPN-type multi-emitter transistor and an output stage formed of a single NPN-type inverter transistor.

In such a conventional gate array LSI device, it is necessary to pull-down, by the output stage transistor, a large amount of current from the power source through each emitter of the multi-emitter transistor of the corresponding input terminal of the next stage. Therefore, it is impossible to increase the fan-out number of each of the pre-stage gate circuits. Moreover, since the output stage of each inner gate circuit is formed of a single inverter transistor, the rise time of the output signal, apart from the fall time thereof, varies greatly depending on the load capacitance. These disadvantages significantly limit the degree of freedom of the logical design.

SUMMARY OF THE INVENTION

In order to solve the above-mentioned problems of the conventional device, the present invention adopts the idea of using PNP-type transistors in the input stage and adding an off-buffer circuit to the output stage in each inner gate circuit of a gate array LSI device having a plurality of inner gate circuits.

It is the principal object of the present invention to decrease the dependency of the switching speed of each inner gate circuit on the load capacitance and on the fan-out number and to increase the fan-out number for every gate circuit unit, thereby increasing the freedom of the logical design of a gate array LSI device.

According to the present invention, there is provided a gate array LSI device having a plurality of inner gate circuits, each of the inner gate circuits including one or more PNP-type transistors, each of which receives an input signal at the base thereof; a first NPN-type transistor whose base is connected to the emitters of the PNP-type transistors; and an output buffer circuit. The output buffer circuit includes a second NPN-type transistor, which is controlled by the signal from the emitter of the first NPN-type transistor and which pulls down electric charges from an output terminal, and a third NPN-type transistor, which is controlled by the signal from the collector of the first NPN-type transistor and which is connected in series to the second NPN-type transistor so as to supply a charging current to the output terminal.

DESCRIPTION OF THE PREFERRED EMBODIMENTS

Before describing the preferred embodiments, an explanation will be given with reference to a computer system which uses conventional peripheral semiconductor devices.

Figure 1:
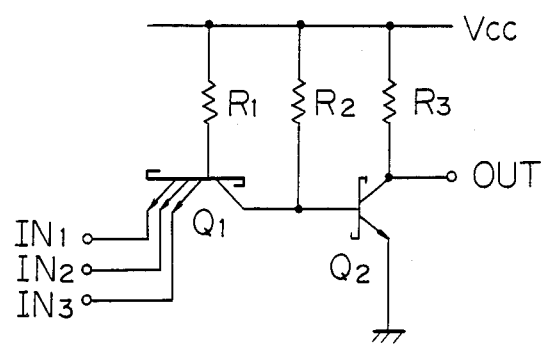
FIG. 1 and FIG. 2 are electric circuit diagrams of structures of an inner gate circuit used in a conventional gate array LSI device.

FIG. 1 is a circuit diagram of an inner gate circuit used in a conventional gate array LSI device. The circuit of FIG. 1 is composed of an NPN-type multiemitter transistor $Q_1$ which forms an input gate stage, an NPN-type inverter transistor $Q_2$ used for an output stage, resistors $R_1$, $R_2$, $R_3$, and so on.

In the circuit of FIG. 1, when one or more of the input signals, input to the emitters of the transistors $Q_1$, is low, the current flowing from a power source $V_{cc}$ through the resistor $R_1$ flows into the emitter, whose potential is rendered low, so that the potential of the collector of the transistor $Q_2$ is cut off, and an output signal OUT becomes high. If all the input signals $IN_1$, $IN_2$ and $IN_3$ are high, the collector voltage of the transistor $Q_1$ becomes high and the transistor $Q_2$ is turned on. Therefore, the output signal OUT becomes low.

Figure 2:
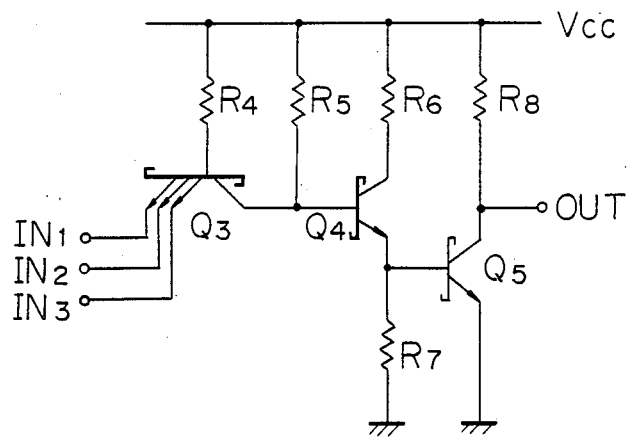

FIG. 2 is a circuit diagram of another example of an inner gate circuit used in a conventional gate array LSI device. The circuit of FIG. 2 differs from that of FIG. 1 in that an NPN-type buffer transistor $Q_4$ is inserted between an input multi-emitter transistor $Q_3$ and an output inverter transistor $Q_5$ so as to increase the drive ability of the output inverter transistor $Q_5$ and, to some extent, prevent the switching speed from deteriorating due to the capacitive load.

As mentioned earlier, these inner gate circuits have the disadvantages of large input currents, which cause a decrease in the fan-out number, and cause considerable dependency of the rise time on the load capacitance.

According to the present invention, there is provided a gate array LSI device which overcomes these problems.

Figure 3:
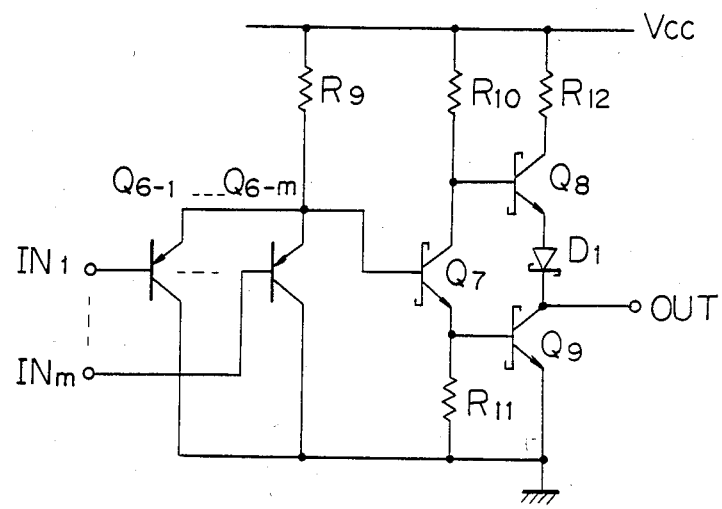
FIG. 3 is an electric circuit diagram of a structure of an inner gate circuit used in a gate array LSI device of an embodiment according to the present invention.

FIG. 3 is a circuit diagram of a structure of a transistor-transistor logic (TTL) inner gate circuit used in a gate array LSI device as an embodiment of the present invention. The circuit of FIG. 3 comprises PNP-type input transistors $Q_{6-1}, \ldots, Q_{6-m}$; and NPN-type transistor $Q_7$, whose base is connected to the commonly connected emitters of these input transistors; an NPN-type inverter transistor $Q_9$, whose base is connected to the emitter of the transistor $Q_7$ and whose emitter is grounded; an off-buffer transistor $Q_8$ of the NPN-type, whose base is connected to the collector of the transistor $Q_7$ and whose emitter is connected to the collector of the inverter transistor $Q_9$ through a Schottky barrier diode $D_1$, and so on. All the transistors $Q_7$, $Q_8$, and $Q_9$ are Schottky transistors.

In the circuit of FIG. 3, if one or more of the input signals $IN_1, \ldots, IN_m$ is low, one or more of the input PNP-type transistors $Q_{6-1}, \ldots, Q_{6-m}$ is turned on, so that the base of the transistor $Q_7$ in the next stage is pulled down to low. Therefore, the transistor $Q_7$ is turned off, the base of the inverter transistor $Q_9$ at the output stage is rendered low by a resistor $R_{11}$, and the base potential of the off-buffer transistor $Q_8$ is rendered high by a resistor $R_{10}$. As a result, the transistor $Q_9$ is turned off and the transistor $Q_8$ is turned on, thereby rendering the output signal OUT, i.e., the collector voltage of the transistor $Q_9$, high.

If all the input signals $IN_1, \ldots, IN_m$ are high, all the input PNP-type transistors $Q_{6-1}, \ldots, Q_{6-m}$ are in a turned-off state. Therefore, a current flows into the base of the transistor $Q_7$ from the power source $V_{cc}$ through a resistor $R_9$, and the transistor $Q_7$ is turned on. As a result, the inverter transistor $Q_9$ is turned on and the off-buffer transistor $Q_8$ is turned off, so that the output voltage OUT becomes low. In this way, the circuit of FIG. 3 operates as a NAND gate.

Figure 4:
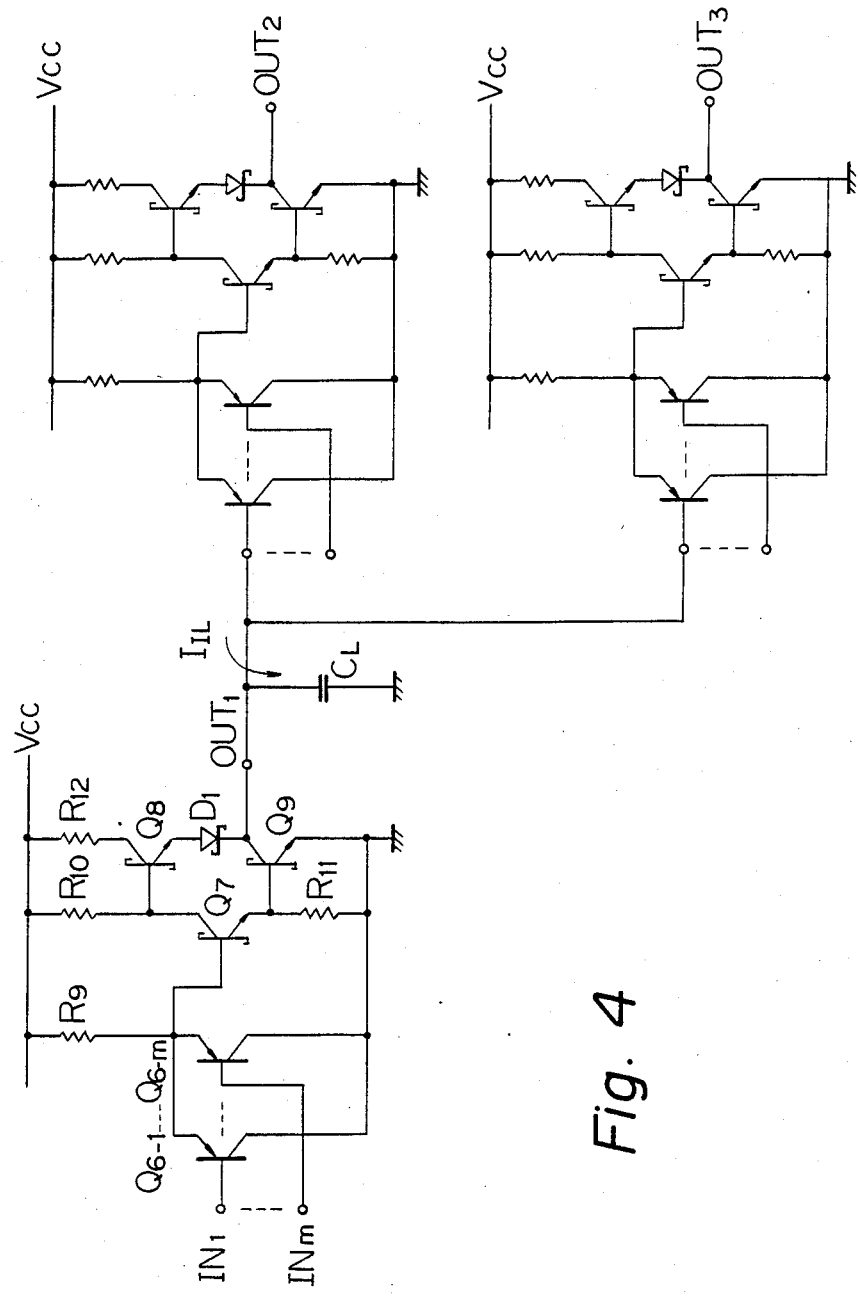
FIG. 4 is an electric circuit diagram of connections between a plurality of inner gate circuits illustrated in FIG. 3.

FIG. 4 is a circuit diagram of the connections between the inner gate circuits of FIG. 3. In FIG. 4, $C_L$ designates a load capacitance caused by the stray capacitance of the connection lines, the input capacitance of the succeeding stage circuits, and so on.

In the circuit of FIG. 4, when the output signal $OUT_1$ of the first-stage circuit falls, the inverter transistor $Q_9$ is turned on so that the output signal $OUT_1$ falls rapidly. When the output signal $OUT_1$ rises, the transistor $Q_8$ is turned on so that the load capacitance $C_L$ is quickly charged.

In each of the gate circuits shown in FIG. 3 and FIG. 4, since the input transistors are not multi-emitter NPN-type transistors but PNP-type transistors which receive the input signals at the bases thereof, it is possible to greatly decrease the current $I_{IL}$ flowing from each of the input circuits of the gate circuit to the pull-down transistor $Q_9$ of the output stage of the pre-stage circuit connected to the gate circuit. This is because the current $I_{IL}$ is a base current of the PNP-type transistor which is much smaller than the emitter current of the NPN-type multi-emitter transistor shown in FIG. 1 or 2. Therefore, the amount of the total current $I_{IL}$ which the pull-down transistor $Q_9$ must pull-down, is decreased. Consequently, it is possible to greatly increase the maximum fan-out number of each gate circuit. For example, the fan-out number of the conventional circuit is approximately five, while the fan-out number of the circuit of FIG. 3 can be increased to approximately 10.

By using PNP-type input transistors receiving input signals at the bases thereof, it is also possible to sufficiently pull down the potential of the low level signal supplied to the input terminal of the inner gate circuit, even if the resistance of the connection line is relatively high. Therefore, even in a gate array LSI device of large integration density with very thin inner connection lines, the margin of the logic signal becomes large and reliable operation of the device can be attained.

In the circuit of FIGS. 3 and 4, when the output signal $OUT_1$ of the pre-stage circuit rises, the load capacitance $C_L$ is mainly charged by the off-buffer transistor $Q_8$, and the charge current $I_{IL}$ flowing from the succeeding stage circuits to the load capacitance $C_L$ becomes relatively small. This is because each of the input circuits uses a PNP-type transistor and the charge current flows from the emitter-base circuit of each PNP-type transistor, i.e., the base current. However, since the off-buffer transistor $Q_8$ charges the load capacitance $C_L$ very quickly, the decrease in the charge current flowing from the succeeding stages does not significantly deteriorate the switching speed.

Figure 5:
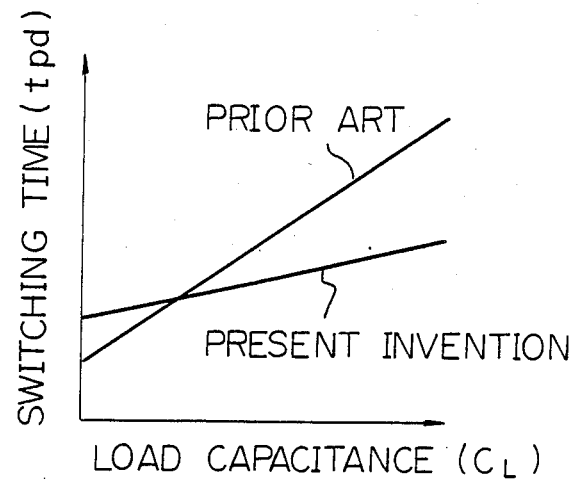
FIG. 5 is a graph of the characteristic of the circuit of FIG. 3 in comparison with conventional circuits.

FIG. 5 is a graph of the variation of the switching time $t_{pd}$ of each of the gate circuits of FIG. 3 and the gate circuit of FIG. 1 or 2 when the load capacitance $C_L$ is changed. In FIG. 5, the switching time $t_{pd}$ is the average value of the rise time $t_{PLH}$ and the fall time $t_{PLH}$ of the output signal OUT. As apparent from FIG. 5, the variation of the switching time $t_{pd}$ with respect to the variation of the load capacitance $C_L$ of the inner gate circuit used in the gate array LSI device, i.e., of the circuit of FIG. 3, is much smaller than that of the inner gate circuit used in the conventional gate array LSI device, i.e., of the circuit of FIG. 1 or FIG. 2. This is because the circuit of FIG. 3 comprises an additional off-buffer circuit at the output stage thereof, which significantly reduces the dependency of the rise time of the output signal on the load capacitance $C_L$.

Figure 6:
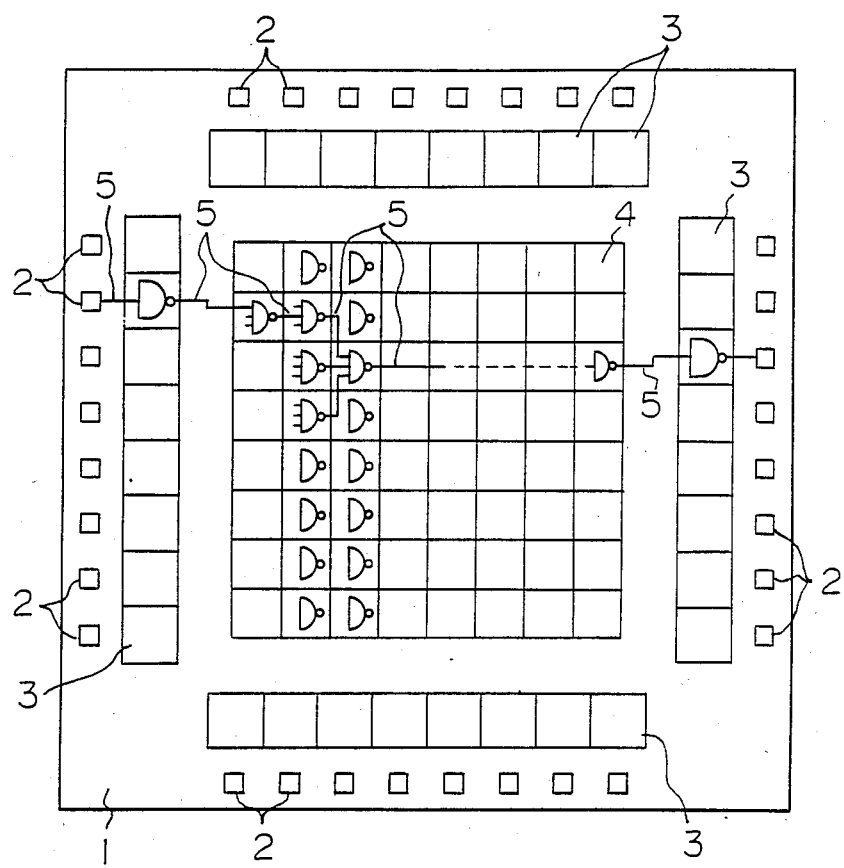
FIG. 6 is a schematic plan view of a circuit layout on a semiconductor chip of a gate array LSI device according to the present invention.

FIG. 6 is a schematic plan view of an arrangement of circuits on a semiconductor chip of a gate array LSI device according to the present invention. In FIG. 6, reference numeral 1 designates a semiconductor chip on which are formed bonding pads 2, input/output buffers 3, and inner gate circuits 4 each having a circuit structure, for example, shown in FIG. 3. Reference numerals 5 designate connection lines made of, for example, aluminum.

Since, in a gate array LSI device, the connections between circuits are determined in accordance with the logical circuit designed and proposed, for example, by each customer, there is considerable variation in the pattern and the length of each of the connection lines and the fan-out number of each inner gate circuit. Therefore, the load condition, such as the load capacitance, also varies greatly in each inner gate circuit. However, in the gate array LSI device according to the present invention, since each of the inner gate circuits uses an off-buffer and PNP-type input transistors, the variation in the load condition does not affect the performance of each inner gate circuit.

In summary, according to the present invention, since PNP-type transistors are used in the input stage of the inner gate circuit and an off-buffer circuit is added to the output stage, the dependency of the switching speed of each gate circuit on the load capacitance becomes small and the maximum fan-out number can be increased. Therefore, the variation of the switching speed of each fundamental gate circuit arising from the length of the inner connection lines becomes small and the margin of the maximum fan-out number of each fundamental gate circuit becomes large. As a result, the freedom of logical design is greatly increased, thereby reducing the load of the designer and increasing the reliability of the LSI device.

We claim:

1. A gate array LSI device having a plurality of inner gate circuits and having an output terminal, each of said inner gate circuits comprising:
   PNP-type transistors, each having a base for receiving an input signal, each having an emitter, and each having a collector connected to ground;
   a first NPN-type transistor having a base commonly connected to the emitters of said PNP-type transistors; and
   an output buffer circuit including:
      a second NPN-type transistor, operatively connected to said first NPN-type transistor, controlled by the signal at the emitter of said first NPN-type transistor for pulling down electric charges on the output terminal; and
      a third NPN-type transistor, operatively connected to said first NPN-type transistor and the output terminal and connected in series to said second NPN-type transistor, controlled by the signal at the collector of said first NPN-type transistor and supplying a charging current via said second NPN-type transistor to said output terminal, said inner gate circuits connected together by providing connection lines between each inner gate circuit for operatively connecting the bases of said PNP-type transistors in one of said inner gate circuits to the emitter of said third NPN-type transistor in said output buffer circuit of another one of said inner gate circuits in accordance with a desired logic circuit.

2. A gate array LSI device according to claim 1, wherein said one or more PNP-type transistors are operatively connected in parallel with each other.

3. A gate array LSI device according to claim 1, wherein said gate array further comprises a diode operatively connected between the emitter of said third NPN-type transistor and the collector of said second NPN-type transistor.

4. A gate array LSI device according to claim 1, wherein said gate array is operatively connectable to a power source and further comprises a protective resistor connected to the power source, the collector of said third NPN-type transistor being connected to the protective resistor.

5. A gate array LSI device according to claim 1, operatively connectable to a power source and further comprising:
   a first resistor operatively connected to the power source;
   a second resistor operatively connected to ground;
   a third resistor operatively connected to the power source; and
   a protective resistor operatively connected to the power source; and
   a diode operatively connected to the collector of said second NPN-type transistor,
   wherein the emitters of said one or more PNP-type transistors are operatively connected to said first resistor, the collector of said first NPN-type transistor is operatively connected to the base of said third NPN-type transistor and to said third resistor, the emitter of said first NPN-type transistor is operatively connected to the base of said second NPN-type transistor and to said second resistor, the emitter of said second NPN-type transistor is operatively connected to ground, the emitter of said third NPN-type transistor is operatively connected to said diode, and the collector of said third NPN-type transistor is operatively connected to said protective resistor.

6. A gate array LSI device according to claim 1, wherein said plurality of said inner gate circuits are connected in cascade.

7. A gate array LSI device operatively connectable to receive an input signal, having an output terminal, said gate array LSI comprising:
   a semiconductor substrate;
   a plurality of bonding pads formed on said semiconductor substrate;
   a plurality of input/output buffer circuits formed on said semiconductor substrate;
   a plurality of inner gate circuits including:
      PNP-type transistors, each having a base for receiving an input signal, each having a collector connected to ground and each having an emitter;
      a first NPN-type transistor having a base commonly connected to the emitters of said PNP-type transistors, having an emitter and having a collector; and
      an output circuit including:
         a second NPN-type transistor, operatively connected to the output terminal and said first NPN-type transistor, controlled by the signal on the emitter of said first NPN-type transistor, for outputting electric charges from the output terminal; and
         a third NPN-type transistor, having an emitter operatively connected in series with said second NPN-type transistor, having a base operatively connected to said first NPN-type transistor, and having a collector, said third NPN-type transistor being controlled by the signal from the collector of said first NPN-type transistor and for supplying a charging current to the output terminal, said inner gate circuits being connected together by providing connection lines between each inner gate circuit for operatively connecting the base of said one or more PNP-type transistors of one of said inner gate circuits to the emitter of said third NPN-type transistor in said output circuit of another one of said inner gate circuits in accordance with a desired logic function.

8. A gate array LSI device according to claim 7, wherein said one or more PNP-type transistors are operatively connected in parallel with each other.

9. A gate array LSI device according to claim 7, further comprising a diode having a cathode operatively connected to the collector of said second NPN-type transistor, and wherein the emitter of said third NPN-type transistor is operatively connected to the anode of said diode.

10. A gate array LSI device according to claim 7, further comprising a power source and a protective resistor operatively connected to the power source, wherein the collector of said third NPN-type transistor is operatively connected to said protective resistor.

11. A gate array LSI device according to claim 7, operatively connectable to a power source and further comprising:
   a first resistor operatively connected to the power source;
   a second resistor operatively connected to ground;
   a diode operatively connected to the collector of said second NPN-type transistor;
   a third resistor operatively connected to the power source; and
   a protective resistor operatively connected to the power source,
   wherein the emitters of said one or more PNP-type transistors are connected to said first resistor, the collector of said first NPN-type transistor is connected to the base of said third NPN-type transistor and to said third resistor, the emitter of said first NPN-type transistor is operatively connected to the base of said second NPN-type transistor and to said second resistor, the emitter of said second NPN-type transistor is operatively connected to ground, the emitter of said third NPN-type transistor is operatively connected to said diode, and the collector of said third NPN-type transistor is operatively connected to said protective resistor.

12. A gate array LSI device according to claim 7, wherein said plurality of said inner gate circuits are connected in cascade.

13. A gate array LSI device according to claim 7, wherein said input buffer circuits have input and output terminals, and said inner gate circuits have input and output terminals, wherein an input terminal of one of said input buffer circuits is operatively connected to one of said bonding pads, wherein an output terminal of one of said input buffer circuits is connected to the input terminal of one of said plurality of inner gate circuits having an output terminal operatively connected to the input terminal of another one of said inner gate circuits, and wherein the output terminal of one of said output buffer circuits is operatively connected to another one of said bonding pads.

* * * * *

UNITED STATES PATENT AND TRADEMARK OFFICE
CERTIFICATE OF CORRECTION

PATENT NO. : 4,689,502

DATED : AUGUST 25, 1987

INVENTOR(S) : YOSHIKI SHIMAUCHI ET AL.

It is certified that error appears in the above-identified patent and that said Letters Patent is hereby corrected as shown below:

FRONT PAGE, [63], line 1, "Mar. 31, 1983," should be --Mar. 26, 1984--.

Col. 1, line 7, "Mar. 31, 1983" should be --Mar. 26, 1984--.
line 38, "preferabley" should be --preferable--.

Col. 2, line 55, after "transistor" insert --$Q_1$ becomes low. Therefore, the transistor--.

Col. 5, line 64, delete "and".

Signed and Sealed this

Second Day of February, 1988

Attest:

DONALD J. QUIGG

Attesting Officer

Commissioner of Patents and Trademarks